United States Patent
Kuo et al.

(10) Patent No.: US 12,032,284 B2
(45) Date of Patent: Jul. 9, 2024

(54) ADVANCED-PACKAGING HIGH-VOLUME-MODE DIGITAL-LITHOGRAPHY-TOOL

(71) Applicant: Applied Materials, Inc., Santa Clara, CA (US)

(72) Inventors: Shih-Hao Kuo, Hsinchu (TW); Hsiu-Jen Wang, Taichung (TW); Ulrich Mueller, Berkeley, CA (US); Jang Fung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 17/872,546

(22) Filed: Jul. 25, 2022

(65) Prior Publication Data

US 2024/0027896 A1 Jan. 25, 2024

(51) Int. Cl.
*G03F 7/00* (2006.01)
*G03F 7/20* (2006.01)

(52) U.S. Cl.
CPC .............. *G03F 7/0002* (2013.01); *G03F 7/20* (2013.01); *G03F 7/70358* (2013.01); *G03F 7/70975* (2013.01)

(58) Field of Classification Search
CPC ...... G03F 7/0002; G03F 7/20; G03F 7/70358; G03F 7/70975; G03F 7/70433; G03F 7/70783; H01L 24/00

USPC .......................................................... 438/106
See application file for complete search history.

(56) References Cited

U.S. PATENT DOCUMENTS

| | | | |
|---|---|---|---|
| 2004/0080734 A1* | 4/2004 | Taniguchi | G03F 7/70783 355/53 |
| 2004/0185662 A1* | 9/2004 | Fujisawa | G01B 11/306 438/689 |
| 2019/0259648 A1* | 8/2019 | Yudovsky | H01L 21/6838 |
| 2020/0194290 A1* | 6/2020 | Gopalan | H01L 21/6838 |
| 2022/0252988 A1* | 8/2022 | Werkman | G03F 7/705 |

\* cited by examiner

*Primary Examiner* — Caleen O Sullivan
(74) *Attorney, Agent, or Firm* — Kilpatrick Townsend & Stockton LLP (57) ABSTRACT

Exemplary methods of packaging a substrate may include rotationally aligning a substrate to a predetermined angular position. The methods may include transferring the substrate to a metrology station. The methods may include measuring a topology of the substrate at the metrology station. The methods may include applying a first chucking force to the substrate to flatten the substrate. The methods may include generating a mapping of a die pattern on an exposed surface of the substrate. The methods may include transferring the substrate to a printing station. The methods may include applying a second chucking force to the substrate to flatten the substrate against a surface of the printing station. The methods may include adjusting a printing pattern based on the mapping of the die pattern. The methods may include printing the printing pattern on the exposed surface of the substrate.

18 Claims, 9 Drawing Sheets

ADVANCED-PACKAGING HIGH-VOLUME-MODE DIGITAL-LITHOGRAPHY-TOOL

FIELD OF THE INVENTION

The present technology relates to components and apparatuses for semiconductor manufacturing. More specifically, the present technology relates to lithography systems and other semiconductor processing equipment used in advanced packaging.

BACKGROUND OF THE INVENTION

Integrated circuits are made possible by processes which produce intricately patterned material layers on substrate surfaces. After the integrated circuits have been formed on a substrate, the substrate is typically diced into individual dies. Once the semiconductor fabrication is finished on a die, the die is typically attached to a PCB board or otherwise placed in electrical communication with other die components in order to enable the die to perform a designed function. In order to achieve these purposes, one or several dies need to be "packaged" first to connect the signal and adapted the feature dimension difference between die with PCB board. When using conventional techniques to package a die, the die must be positioned within tolerances that are on the order of hundreds or dozens of micrometers. However, following the Moore's law, as the dies become smaller and more powerful, the packaging must also evolve to next generation to prevent impact the die performance.

In newer dies, the critical dimension tolerances for handling dies may be on the order of a few micrometers, or even to sub-micrometer levels. Additionally, with the "warpage effect" caused by heterogeneous integration and "die shift/ rotation problem" due to die pick & place mechanism tolerances, traditional packaging solutions are no longer suitable for current challenge as such solutions do not provide sufficient precision to handle more advanced dies.

Thus, there is a need for improved systems and methods that can be used to efficiently package dies. These and other needs are addressed by the present technology.

BRIEF SUMMARY OF THE INVENTION

Exemplary methods of packaging a substrate may include rotationally aligning a substrate to a predetermined angular position. The methods may include transferring the substrate to a metrology station. The methods may include measuring a topology of the substrate at the metrology station. The methods may include applying a first chucking force to the substrate to flatten the substrate. The methods may include generating a mapping of a die pattern on an exposed surface of the substrate. The methods may include transferring the substrate to a printing station. The methods may include applying a second chucking force to the substrate to flatten the substrate against a surface of the printing station. The methods may include adjusting a printing pattern based on the mapping of the die pattern. The methods may include printing the printing pattern on the exposed surface of the substrate.

In some embodiments, the methods may include varying a magnitude of the first chucking force across an area of the substrate based on the topology of the substrate. The first chucking force may be applied using one or both of a vacuum chuck and an electrostatic chuck. The methods may include re-measuring the topology of the substrate after applying the first chucking force. Measuring a topology of the substrate may include gathering data from one or both of a capacitive sensor and an optical sensor. Adjusting a printing pattern based on the mapping of the die pattern may include adjusting at least a portion of the printing pattern based on one or both of a lateral position and rotational position of at least one die on the substrate. The substrate may include a first substrate. The method may include, while printing the printing pattern on the exposed surface of the first substrate, rotationally aligning a second substrate to the predetermined angular position, transferring the second substrate to the metrology station, measuring a second topology of the second substrate at the metrology station, applying a third chucking force to the second substrate to flatten the second substrate, and generating a second mapping of a die pattern on an exposed surface of the second substrate. The methods may include transferring the second substrate to a buffer station. The methods may include transferring the second substrate to the printing station. The methods may include applying a fourth chucking force to the substrate to flatten the second substrate against the surface of the printing station. The methods may include adjusting a second printing pattern of the second substrate based on the second mapping of the die pattern. The methods may include printing the second printing pattern on the exposed surface of the substrate.

Some embodiments of the present technology may encompass methods of packaging a substrate. The methods may include rotationally aligning a plurality of substrates to a predetermined angular position. The methods may include measuring a topology of each substrate. The methods may include applying a first chucking force to each substrate to flatten the respective substrate. The methods may include generating a mapping of a die pattern for an exposed surface of substrate. The methods may include transferring each substrate to a printing station. The methods may include applying a second chucking force to each substrate to flatten the respective substrate against a surface of the printing station. The methods may include adjusting a respective printing pattern for each substrate based on the mapping of the die pattern for each respective substrate. The methods may include printing the respective printing pattern on the exposed surface of each respective substrate.

In some embodiments, the methods may include determining a magnitude of the first chucking force at a number of locations across an area of each substrate needed to flatten the respective substrate. The methods may include varying the magnitude of the first chucking force across the area of the respective substrate based on the determination. Rotationally aligning each substrate to the predetermined angular position may include identifying an alignment mark on the respective substrate and rotating the respective substrate to align the alignment mark to the predetermined angular position. The methods may include flipping each substrate to expose an unprinted surface of the respective substrate. The methods may include rotationally aligning each substrate to the predetermined angular position. The methods may include measuring the topology of each substrate. The methods may include applying a third chucking force to each substrate to flatten each respective substrate. The methods may include generating a mapping of an additional die pattern on the unprinted surface of each substrate. The methods may include transferring each substrate to the printing station. The methods may include applying a fourth chucking force to each substrate to flatten the respective substrate against the surface of the printing station. The methods may include adjusting an additional printing pattern based on the mapping of the additional die pattern. The methods may include printing the additional printing pattern on the unprinted surface of each substrate. The first chucking force may be different for at least one of the plurality of substrates. The first chucking force of a respective substrate and the second chucking force of the respective substrate may be equal. The methods may include transferring at least some of the plurality of substrates to a buffer station. Each of the at least some of the plurality of substrates may be transferred to the printing station from the buffer station. The methods may include measuring a bevel angle on an edge of packaging for each substrate. Adjusting the printing pattern based on the mapping of the die pattern may include calculating one or more differences between the printing pattern and the mapping of the die pattern and adjusting a position of at least a portion of the printing pattern based on the one or more differences.

Some embodiments of the present technology may encompass substrate packaging systems. The systems may include a robotic transfer system having a plurality of robotic arms. The systems may include a substrate aligner that aligns a substrate to a predetermined angular position. The systems may include at least one metrology station. The at least one metrology station may include a topology sensor. The at least one metrology station may include a die pattern sensor. The at least one metrology station may include an adaptive chucking mechanism that is communicatively coupled with the topology sensor. The systems may include a printing station. In some embodiments, the systems may include a substrate buffer station disposed between the at least one metrology station and the printing station.

Such technology may provide numerous benefits over conventional systems and techniques. For example, embodiments of the present technology may provide solutions that handle substrate warpage issues when printing on substrates. In particular, embodiments may implement adaptive chuck mechanisms that effectively flatten substrates prior to any measurement and/or printing operations. Embodiments of the present technology may provide solutions that handle die position drift issues before printing on substrates. In particular, embodiments may implement in-line pattern correction function that effectively mitigate the printing pattern error prior to printing operations. Additionally, the systems described herein may enable a number of substrates to be sequentially and simultaneously printed and prepared for printing to increase throughput of the system. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

As device features reduce in size, tolerances across a substrate surface may be reduced. Oftentimes, film and/or other material layers deposited on a substrate during processing operations may cause a substrate to bow and/or otherwise warp. This warpage may lead to issues during lithography (and other) operations, as the designed pattern to be applied to the substrate may be impacted by the warped shape of the substrate. This may lead to the integrated circuits and/or other components produced from the substrate to have defects and may reduce die yield. Additionally, due to tolerances of the robotic pick-and-place machine that applies dies to the substrate, as well as due to the viscous flow of epoxy that coats the substrate and dies, some or all of the dies placed on a substrate may shift and/or rotate slightly from their intended positions. This may lead to defects, such as conduction issues for the final integrated circuits, and may reduce the yield of a given substrate.

The present technology overcomes these challenges by providing a new design platform that incorporates a digital-lithography system with other modules to create an advanced packaging system. The digital-lithography systems described herein may address the challenges associated with the smaller critical dimensions that are required when packaging smaller and/or more powerful dies. Embodiments may include different variations for each individual packaging product and/or process to meet the needs of a particular application. Embodiments of the present technology may include measuring a topology of the substrates and utilizing an adaptive chuck to substantially flatten the substrate. A number of measurements of the substrate, including an actual layout of dies on the substrate, may be captured while the substrate is flattened. The substrate may then be transferred to a printing station, which may modify a printing layout to adjust the location of one or more printed connections based on the actual layout of dies. The substrate may again be flattened, and the printing pattern may be printed atop the substrate. Embodiments may also provide a modular station approach to substrate packaging, which may help increase the throughput of substrates by prepping some substrates while other substrates are being printed. Accordingly, the present technology may increase yield, produce dies with better conductance, and/or increase throughput through a packaging system.

Although the remaining disclosure will routinely identify specific lithography processes utilizing the disclosed technology, it will be readily understood that the systems and methods are equally applicable to other chambers, as well as processes as may occur in the described chambers. Accordingly, the technology should not be considered to be so limited as for use with these specific lithography processes or chambers alone. The disclosure will discuss one possible system and chamber that may include lid stack components according to embodiments of the present technology before additional variations and adjustments to this system according to embodiments of the present technology are described.

Figure 1:
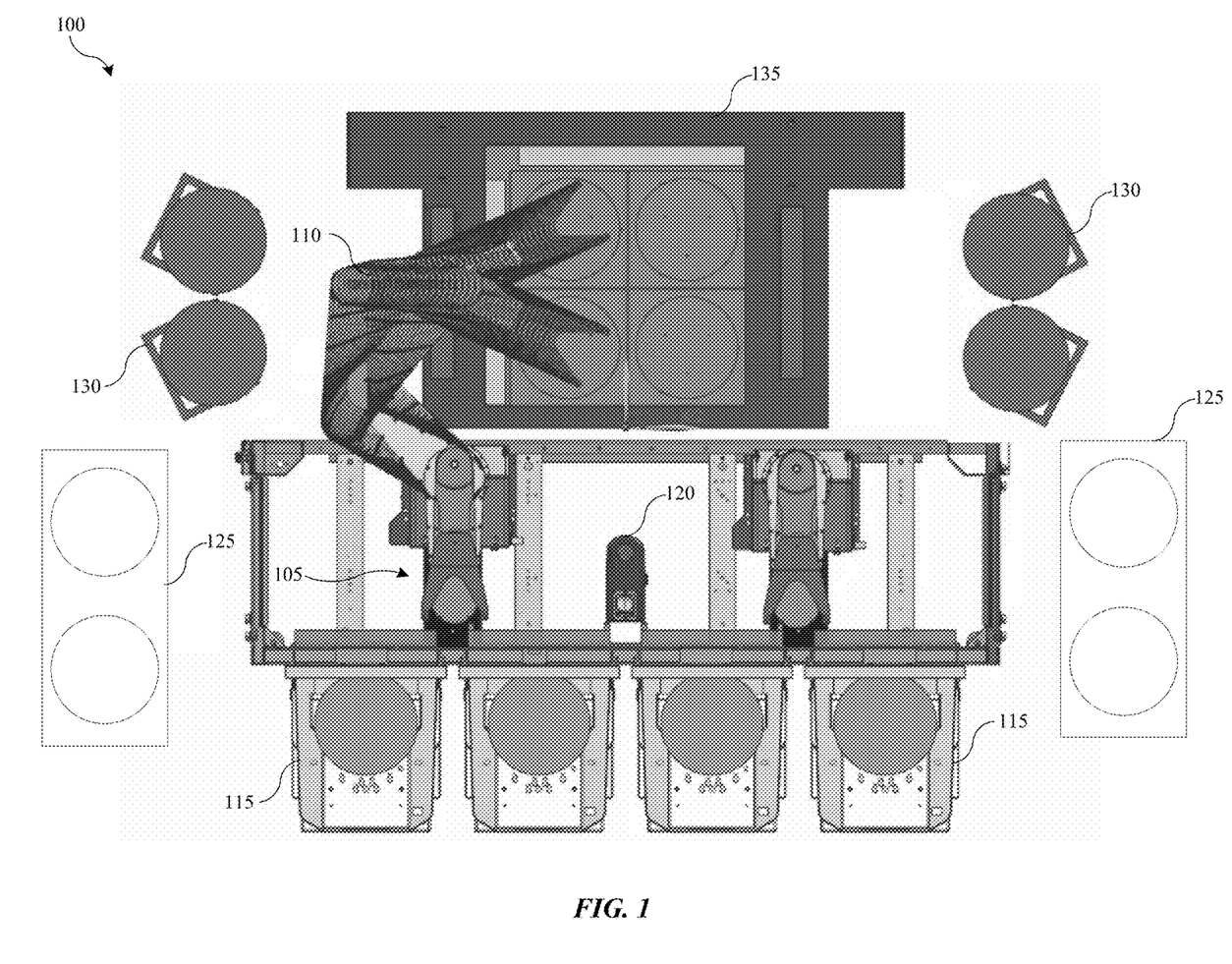
FIG. 1 shows a schematic top plan view of an exemplary packaging system according to some embodiments of the present technology.

FIG. 1 illustrates a schematic top plan view of an exemplary substrate packaging system 100 according to some embodiments of the present technology. The system 100 may be used to perform semiconductor processing operations including lithography operations, as well as other deposition, etching, removal, and cleaning operations. Any aspect of system 100 may also be incorporated with other processing chambers or systems as will be readily understood by the skilled artisan.

System 100 may include a number of different stations or modules, with each station or module performing one or more specific tasks associated with processing substrates. Substrates may be transferred between the various stations using a robotic transfer system 105. Robotic transfer system 105 may include one or more robotic arms 110 that may grasp and/or otherwise engage each substrate to transfer substrates between the various stations. System 100 may include a number of storage units 115 (such as front-open cassette integrated transfer and storage boxes (FOUP)), which may be used to store substrates prior to and/or after printing operations. In some embodiments, one or more of the storage units 115 may serve as intermediate storage areas after one or more printing operations have been performed but prior to additional printing and/or other packaging operations being initiated. While shown with four storage units 115, it will be appreciated that any number of storage units 115 may be included in a single system 100. For example, system 100 may include at least or about one storage unit, at least or about two storage units, at least or about three storage units, at least or about four storage units, at least or about five storage units, at least or about six storage units, at least or about seven storage units, at least or about eight storage units, or more. In some embodiments, some or all of the storage units 115 may be used for multiple functions (e.g., pre-printing storage, intermediate storage, post-printing storage, etc.), while in other embodiments some or all of the storage units 115 may be used for different functions.

System 100 may include one or more substrate aligners 120 that each align substrates to a predetermined angular position. For example, each substrate aligner 120 may include one or more rotating supports and one or more optical sensors. The robotic transfer system 105 may transfer a substrate from a storage unit 115 to a rotating support. The substrate aligner 120 may rotate the substrate until the corresponding optical sensor detects that a mark (such as a notch or other visible alignment marking) on an edge of the substrate has been moved to a predetermined angular position. This alignment process may ensure that each substrate is properly oriented for subsequent printing operations. While shown with a single substrate aligner 120, it will be appreciated that system 100 may include any number of substrate aligners 120. For example, system 100 may include at least or about one substrate aligner, at least or about two substrate aligners, at least or about three substrate aligners, at least or about four substrate aligners, or more. Additionally, each substrate aligner 120 may include any number of sets of rotating supports and optical sensors, which may enable a single substrate aligner 120 to align multiple substrates simultaneously, which may help increase the throughput of system 100.

System 100 may include at least one metrology station 125. Each metrology station may include at least one topology sensor, which may be used to determine the topology of each substrate along a z-direction (which may be orthogonal to a support surface of the metrology station 125). For example, the film layers deposited on the substrate may cause different stresses that lead to bowing or other warpage of the substrate. The topology sensors may be used to identify any variability (i.e., contour or other non-planar region) in the z-direction that is present on the substrate. The topology sensors may include optical sensors (such as depth cameras, mm wave sensors, proximity sensors, etc.), capacitive sensors that may determine a distance between a bottom surface of the substrate and the support surface of the metrology station 125 at different locations about the area of the substrate by detecting a capacitance at the various locations, and/or other sensors that may detect a shape of the substrate in the z-direction. Each metrology station 125 may include one or more chuck mechanisms that are coupled with the support surface of the metrology station 125. The chuck mechanisms may include vacuum chucks, electrostatic chucks, and/or other types of chuck mechanisms. The chuck mechanisms may enable a chucking force to be varied across the area of the substrate, which may enable the chuck to adaptively clamp the substrate to the support surface of the metrology station 125. For example, if a particular substrate includes regions of high bowing and regions of little or no bowing, the clamping force may be increased at or near the regions of high bowing and/or reduced at the regions of little or no bowing. This adaptive chucking force control may enable the chuck mechanism to adjust the clamping force applied to each substrate to flatten the substrate into a substantially planar configuration, with little to no bowing or other warpage present. This may also enable the chucking force to be customized for each substrate in some embodiments, with each substrate being subjected to a chucking force that will flatten any given substrate into a substantially planar configuration, regardless of the substrate topology. As used herein, it will be understood that substantially planar may mean greater than or about 95% planar, greater than or about 96% planar, greater than or about 97% planar, greater than or about 98% planar, greater than or about 99% planar, greater than or about 99.5% planar, or greater. The chucking force may be varied based on measurements from the topology sensor(s). For example, high and low regions of bowing may be detected (such as by mapping the topology of the substrate) and the chucking force may be altered accordingly. In some embodiments, the chucking force may be adjusted sequentially. For example, a first magnitude of chucking force (which may or may not be uniform across an area of the substrate) may be applied, and the topology may be re-measured. If the substrate is not substantially planar, the magnitude of the chucking force may be adjusted at one or more locations and the topology may be measured again. This process may be repeated sequentially any number of times until the substrate is substantially planar.

Each metrology station 125 may include one or more die pattern sensors. Each die pattern sensor may include an optical sensor, such as a camera, that may measure a position of each die present on the substrate. For example, many dies may be adhered or otherwise coupled with an exposed surface of the substrate before the printing operation. These die positions may drive out of a designed position due to the pick and place error and/or molding flow pressure. If printing is performed without any correction, the printed electrical line may not connect to a specific pad on the die correctly. In die pattern sensors, a position and/or rotation (e.g., angular orientation) of each die may be measured by the die pattern sensors, which may enable a mapping of the die pattern of the substrate to be generated and/or otherwise recorded. The mapping may be provided to the printing system for correcting and/or otherwise adjusting the printing pattern to accommodate any die position drift prior to commencing the printing operation. In some embodiments, each metrology station 125 may include one or more bevel sensors. Bevel sensors may be optical sensors that may be used to measure a bevel angle and/or topography on the edge of the packaging of each substrate. While shown having different topology sensors, die pattern sensors, and bevel sensors, it will be appreciated that in some embodiments one or more of the sensors may be combined into a single sensor. For example, a single optical sensor may be used to measure any combination of the topology, die pattern, and/or bevel angle for a given substrate.

As illustrated, system 100 includes two metrology stations 125, with metrology stations 125 being disposed on opposing sides of the substrate aligner 120. However, it will be appreciated that any number of metrology stations 125 may be included in various embodiments. For example, system 100 may include at least or about one metrology station, at least or about two metrology stations, at least or about three metrology stations, at least or about four metrology stations, at least or about five metrology stations, at least or about six metrology stations, or more. Each metrology station 125 may include one or more substations, with each substation being able to perform some or all of the metrology functions described in accordance to metrology station 125. For example, each substation may include a dedicated topology sensor, a dedicated chuck mechanism, a dedicated die pattern sensor, and/or a dedicated bevel sensor. Any number of substations may be provided in a given metrology station 125. For example, each metrology station 125 may include at least or about one substation, at least or about two substations, at least or about three substations, at least or about four substations, or more. By providing multiple substations, each metrology station 125 may perform metrology operations on multiple substrates simultaneously, which may help increase throughput of the system 100.

System 100 may include at least one printing station 135. Each printing station 135 may include one or more stages and/or other support surfaces that may support a lower surface of a substrate. In some embodiments, each stage may be movable such that movement of the stage moves the substrate (or a carrier of the substrate) relative to a printing mechanism of the printing station 135. In some embodiments, the printing mechanism may be movable, while the substrate remains stationary. The printing station may use digital lithography techniques to print various features on the substrate. For example, connections between dies and electrical connectors (such as copper pillars) may be printed atop the substrate using the printing station 135.

In some embodiments, system 100 may include a thermal module that may be used to bake or otherwise heat the substrates after completion of printing operations. For example, the substrate may be baked to help stabilize the printed pattern prior to performing other processing or packaging operations, such as operations to remove light-sensitive material treated during photolithography and/or remove non-light sensitive material after photolithography. Incorporating the thermal module into the system 100 may help larger numbers of substrates/dies be processed and may increase the throughput of the system 100.

System 100 may include a number of buffer stations 130. Each buffer station 130 may include a number of load slots and/or unload slots, which may be used to hold individual substrates before and/or after any printing operations are performed. For example, each buffer station 130 may be disposed between a respective one of the metrology stations 125 and a respective printing station 135. While one or more substrates are being printed, substrates that have completed the metrology operations may be transferred by the robotic transfer system 105 from the metrology station 125 to a load slot of one of the buffer stations 130. Upon completion of the printing operation(s), the printed substrates may be transferred by the robotic transfer system 105 from the printing station 135 to an unload slot of one of the buffer stations 130, and an unprinted substrate may be transferred from a load slot to the printing station 135. While the unprinted substrate is being printed, the previously printed substrate may be transferred from the unload slot to a respective storage unit 115.

Figure 1A:
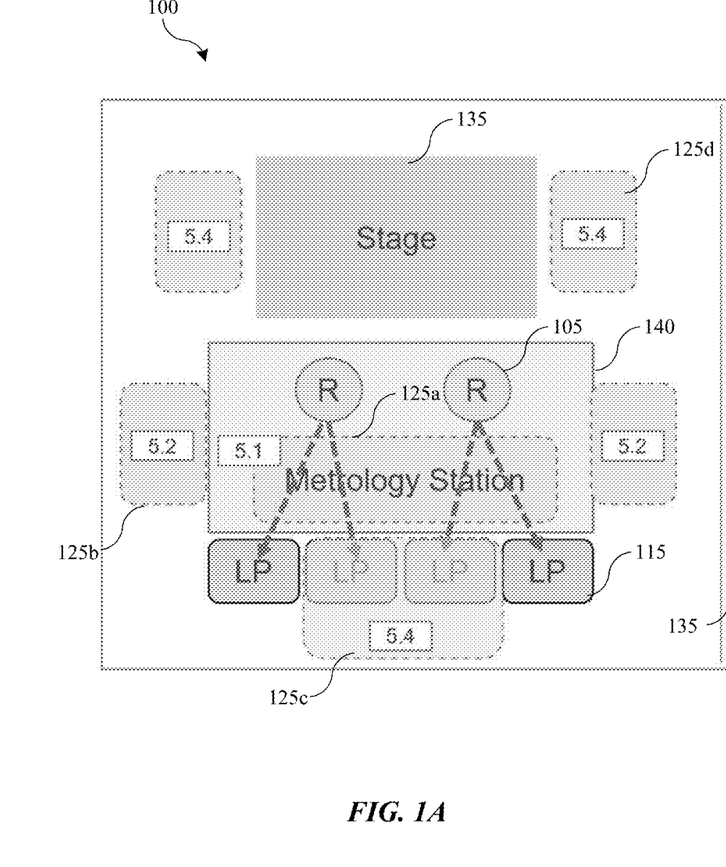
FIG. 1A shows a schematic top plan view of an exemplary packaging system according to some embodiments of the present technology.
Figure 1B:
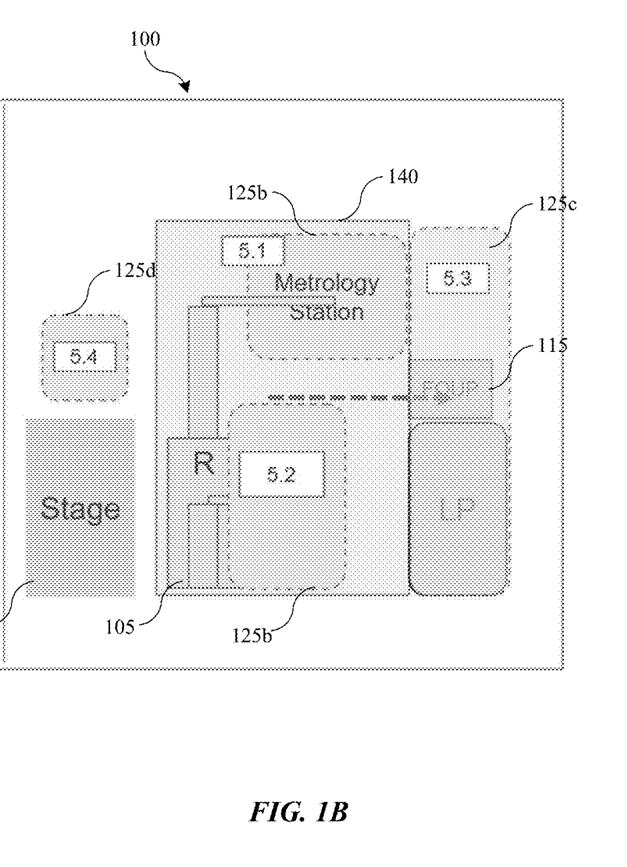
FIG. 1B shows a schematic side elevation view of an exemplary packaging system according to some embodiments of the present technology.

As illustrated, the metrology stations 125 may be positioned adjacent the printing station 135, however the metrology stations 125 may be positioned at other locations within the system 100. For example, as illustrated in FIGS. 1A and 1B, metrology stations 125a may be positioned within a frame of a factory interface 140 (which may include some or all of the robotic transfer system 105), metrology stations 125b may be positioned alongside the factory interface 140, metrology stations 125c may be positioned in front and/or in place of one or more of the storage units 115, and/or metrology stations 125d may be positioned adjacent the printing station 135 (similar to metrology stations 125 shown in FIG. 1). Other metrology station locations may be possible in various embodiments.

Figure 2:
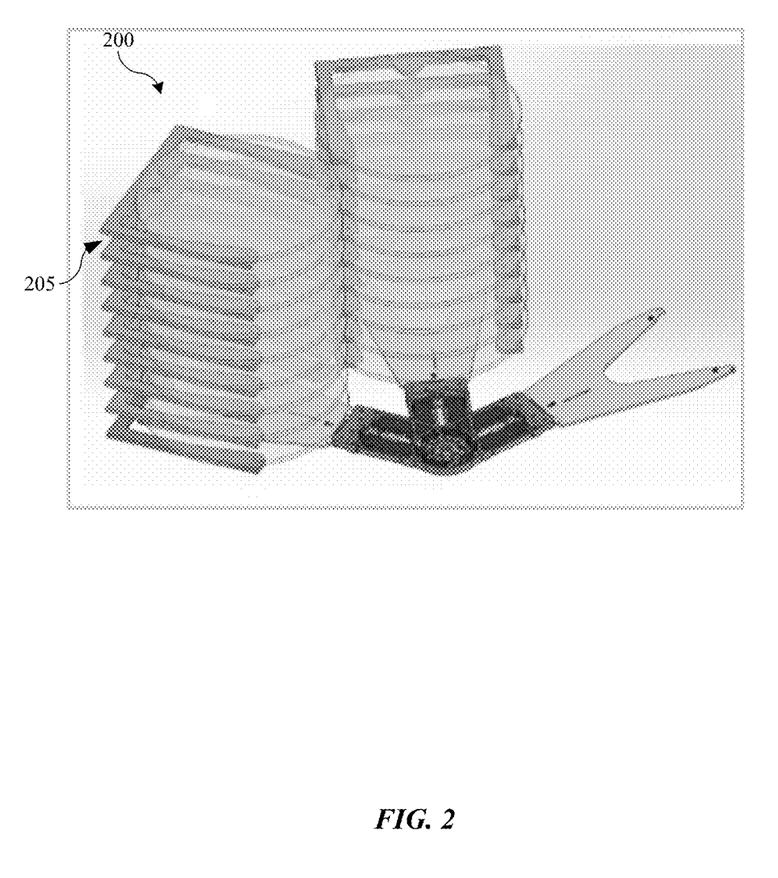
FIG. 2 shows a schematic isometric view of an exemplary buffer station according to some embodiments of the present technology.

FIG. 2 illustrates a schematic isometric view of an exemplary buffer station 200 according to some embodiments of the present technology. FIG. 2 may illustrate further details relating to components in system 100, such as for buffer station 130. Buffer station 200 is understood to include any feature or aspect of buffer station 130 discussed previously in some embodiments. Any aspect of buffer station 200 may also be incorporated with other processing chambers or systems as will be readily understood by the skilled artisan. Buffer station 200 may include a number of slots 205. Each slot 205 may be sized to receive a substrate, which may be transferred to and from the slots 205 by a robotic transfer system (such as robotic transfer system 105). The slots 205 may be arranged in one or more vertical columns, with each column including a number of slots 205. As illustrated, buffer station 200 includes two columns that each have nine slots 205, however other configurations are possible. For example, each buffer station 200 may include at least or about one column, at least or about two columns, at least or about three columns, at least or about four columns, or more. Each column may include at least or about one slot, at least or about two slots, at least or about three slots, at least or about four slots, at least or about five slots, at least or about six slots, at least or about seven slots, at least or about eight slots, at least or about nine slots, at least or about ten slots, at least or about twelve slots, at least or about fourteen slots, at least or about sixteen slots, at least or about eighteen slots, or more. In some embodiments, each slot 205 may be designated as either an unload slot (e.g., receives printed substrates from a printing station) or a load slot (e.g., receives unprinted substrates from a metrology station). In other embodiments, some or all of the slots 205 may be used interchangeably as unload slots and load slots.

Figure 3:
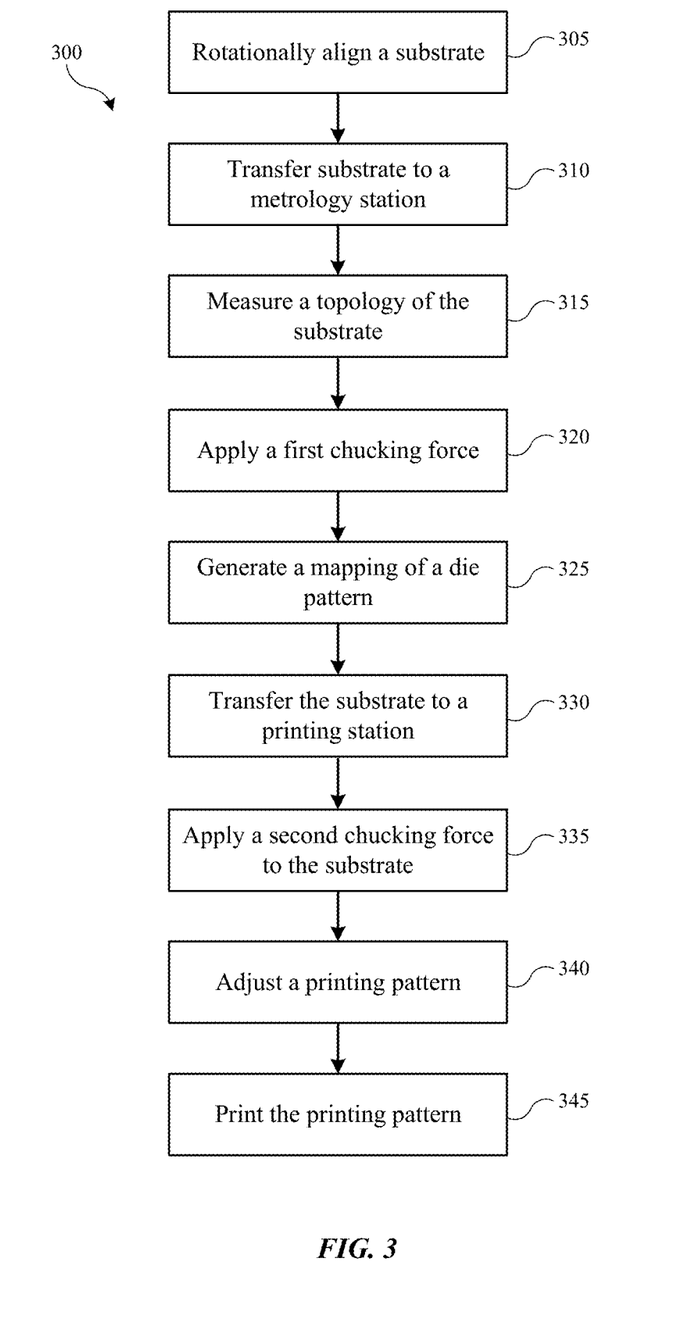
FIG. 3 shows operations of an exemplary method of packaging a substrate according to some embodiments of the present technology.
Figure 4A:
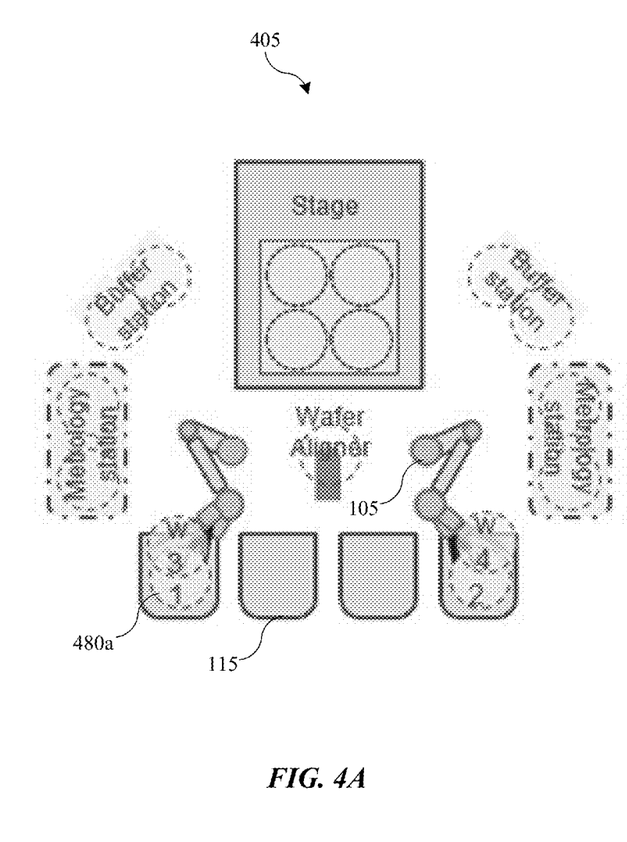
FIGS. 4A-4I show schematic top plan views of a sequence for packaging multiple substrates according to some embodiments of the present technology.
Figure 4B:
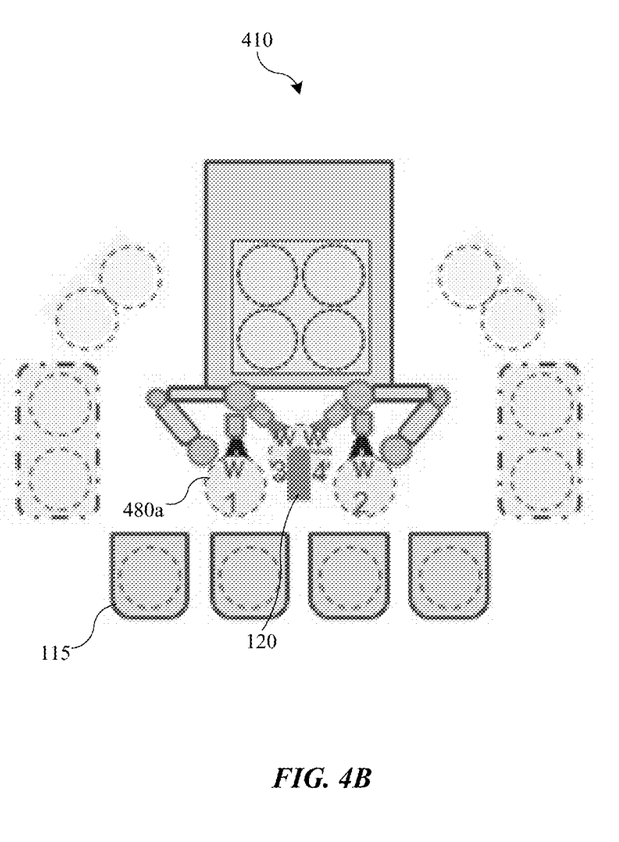
Figure 4C:
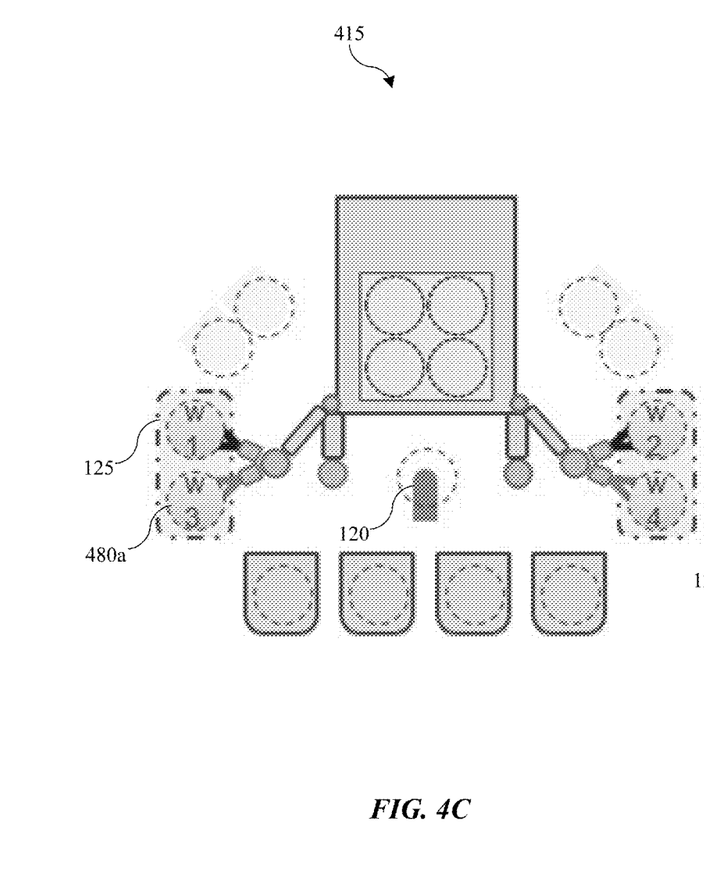
Figure 4D:
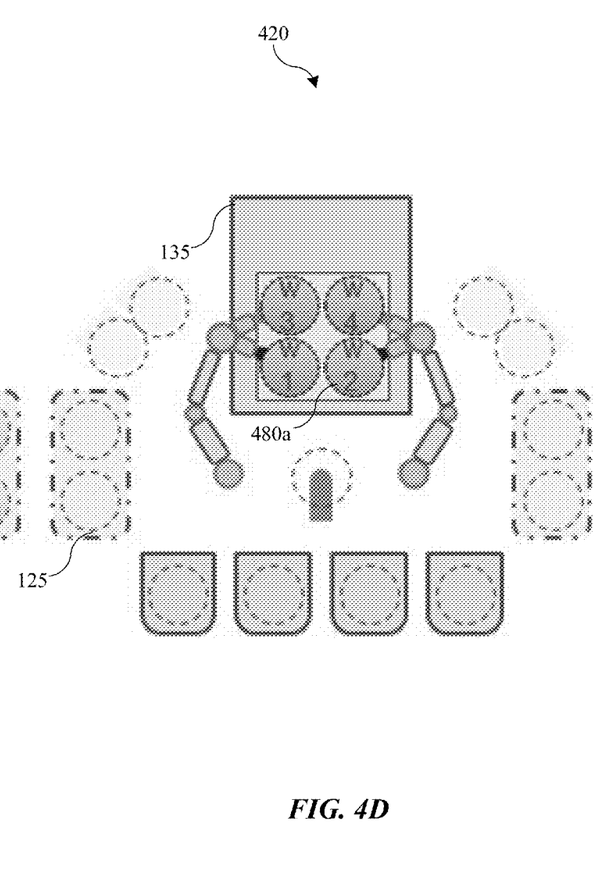
Figures 4E, 4F:
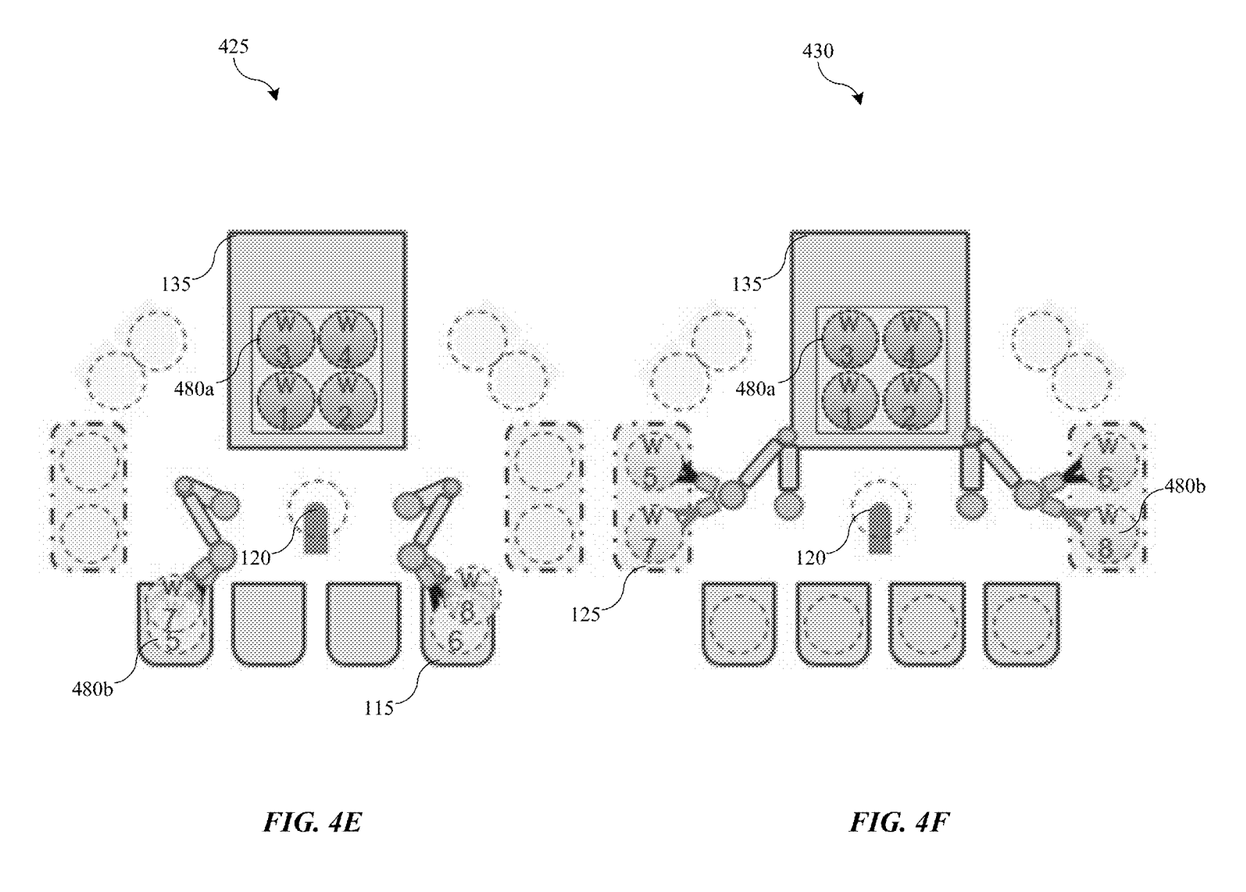
Figure 4G:
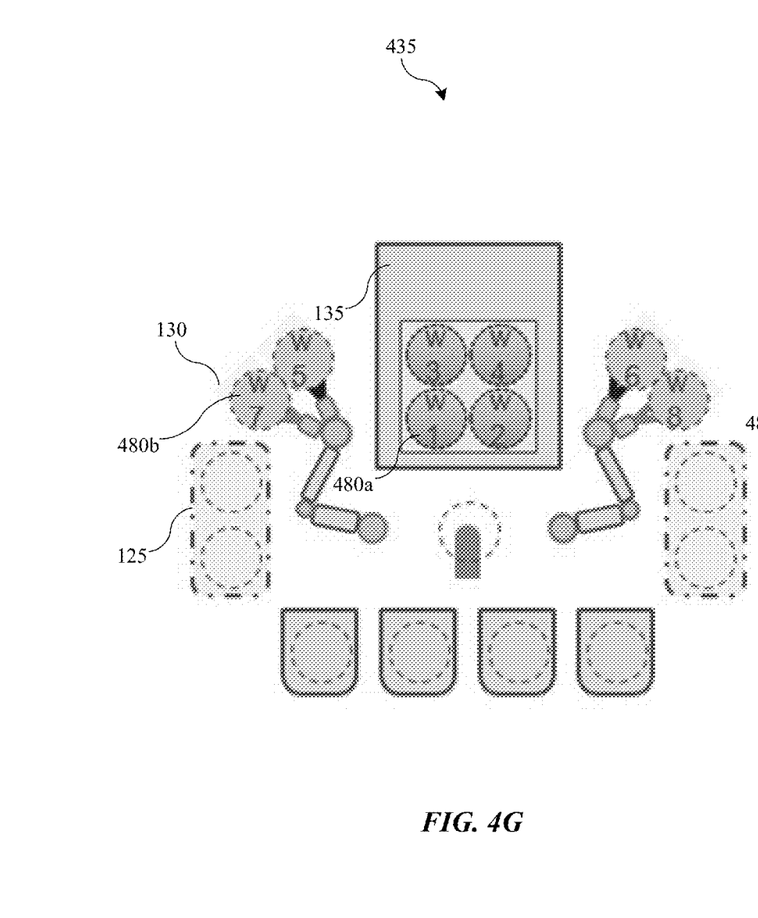
Figure 4H:
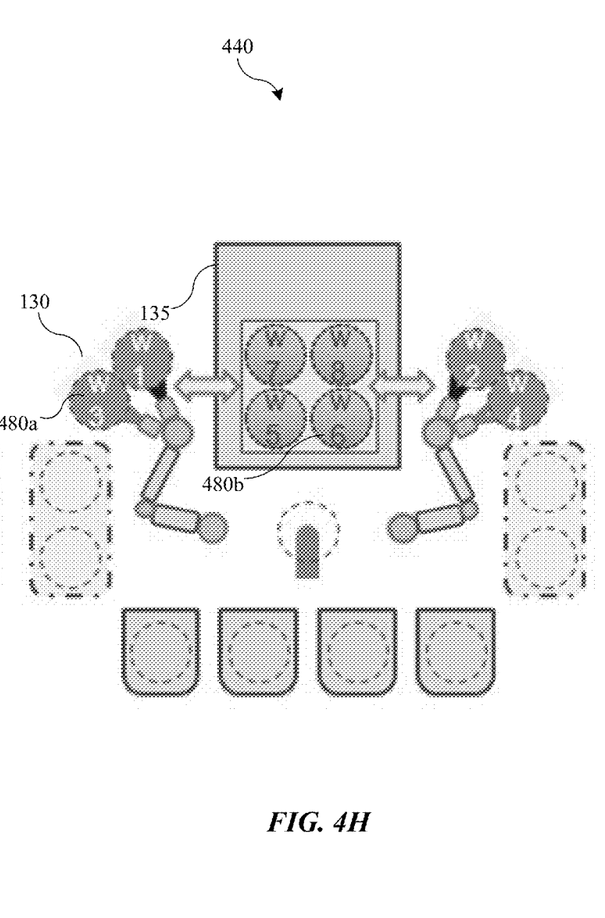
Figure 4I:
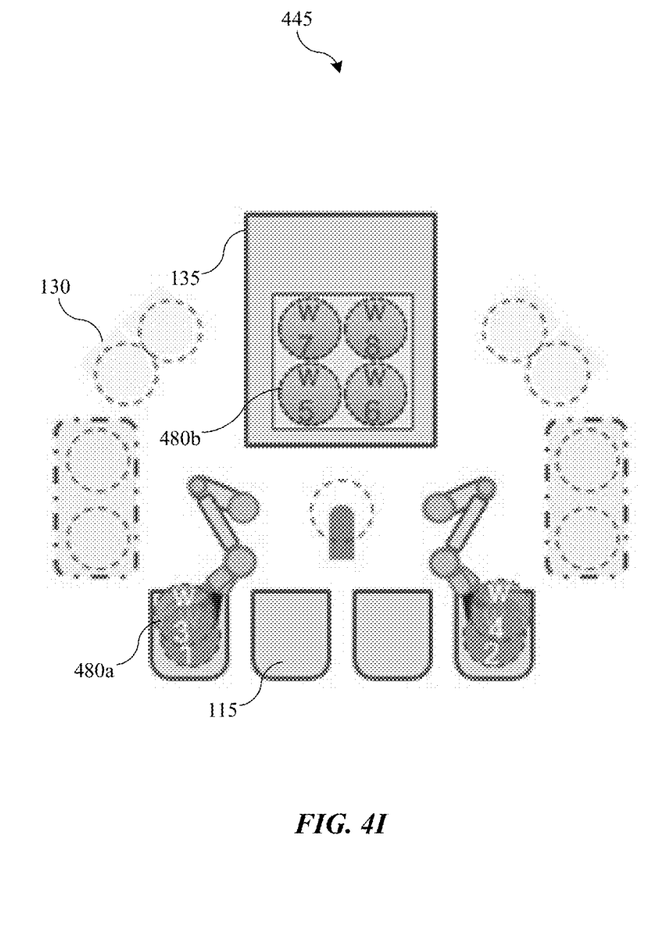

FIG. 3 shows operations of an exemplary method 300 of packaging a substrate according to some embodiments of the present technology. The method may be performed in a variety of processing systems, including processing system 100 described above, which may include metrology station and/or buffer station according to embodiments of the present technology, such as any metrology stations and/or buffer stations discussed previously. Method 300 may include a number of optional operations, which may or may not be specifically associated with some embodiments of methods according to the present technology.

Method 300 may include a packaging method that may include operations for packaging dies, such as integrated circuits and/or other electrical components. The method may include optional operations prior to initiation of method 300, or the method may include additional operations. For example, method 300 may include operations performed in different orders than illustrated. Method 300 may include rotationally aligning a substrate to a predetermined angular position at operation 305. For example, a substrate may be transferred and/or otherwise transported from a storage unit (such as storage unit 115) to a substrate aligner. The substrate may include a number of dies arranged about one or both surfaces of the substrate. A number of electrical connectors, such as copper pillars, may be arranged about some or all of the dies. The packaging process may involve electrically coupling the dies and electrical connectors, such as by printing conductive connections between the dies and respective ones of the electrical connectors.

The transfer of the substrate may be performed by a robotic transfer system (such as robotic transfer system 105) that includes one or more transfer robots that each include at least one robotic arm that may grasp, support, and/or otherwise engage the substrate. Upon being placed on the substrate aligner, an alignment mark on the substrate may be identified, such as by using an optical sensor. The substrate may be rotated to align the alignment mark to the predetermined angular position. This alignment may ensure that the substrate is properly oriented during subsequent steps of the packaging process.

Upon aligning the substrate, the substrate may be transferred to a metrology station, such as by the robotic transfer system, at operation 310. At the metrology station, a topology of the substrate may be measured at operation 315. For example, data may be gathered at a number of locations across the area of the substrate using one or more optical sensors, capacitive sensors, and/or other z-direction sensors. This data may be used to determine whether there are any contours or other deformations that prevent the substrate from being substantially planar. At operation 320, a first chucking force may be applied to the substrate to flatten the substrate. The chucking force may be utilized to reduce or eliminate any bowing or other warpage of the substrate prior to other measurement and/or printing operations, and may be utilized to make the substrate at least substantially planar. A magnitude of the first clamping force may be varied across an area of the substrate based on the topology of the substrate. For example, if a particular substrate includes regions of high bowing and regions of little or no bowing, the clamping force may be increased at or near the regions of high bowing and/or reduced at the regions of little or no bowing. This adaptive chucking force control may enable the chuck mechanism to adjust the clamping force applied to each substrate to flatten the substrate into a substantially planar configuration, with little to no bowing or other warpage present. The chucking force may be varied based on measurements from the topology sensor(s). In some embodiments, the chucking force may be adjusted sequentially. For example, a first magnitude of chucking force (which may or may not be uniform across an area of the substrate) may be applied, and the topology may be re-measured. If the substrate is not substantially planar, the magnitude of the chucking force may be adjusted and the topology may be measured again. This process may be repeated sequentially any number of times until the substrate is substantially planar.

While the first clamping force is applied, the method 300 may include generating a mapping of a die pattern of an exposed surface of the substrate at operation 325. The mapping may include data that indicates an exact position (such as a lateral position and/or angular orientation) of each die on the substrate. For example, while the substrate is clamped in a substantially planar configuration, one or more optical sensors may be used to image and/or otherwise determine an actual layout of dies arranged atop the substrate, which may deviate from a designed layout due to factors such as robotic pick-and-place device tolerances, bevel topography, and shifting that may occur during the application of an epoxy coating over the dies. In a particular embodiments, the sensors may detect positions of the corners of each die and/or marks provided thereon that enable the sensors to more accurately determine a position and/or orientation of each die. The method may optionally include measuring a bevel angle on an edge of packaging for each substrate, which may be done using one or more optical sensors. Once the die pattern mapping and/or bevel angle measurements have been generated, the chucking force may be reduced and/or eliminated, which may enable the substrate to be transferred to a printing station at operation 330.

Once at the printing station, a second chucking force may be applied to the substrate to flatten the substrate against a surface of the printing station at operation 335. For example, a similar adaptive chucking mechanism may be included at the printing station, and may be used to selectively apply a chucking force to the substrate to make the substrate substantially planar. In some embodiments, the chucking force may be varied across the area of the substrate. For example, the second chucking force may be based on the previously measured topology of the substrate and/or the final chucking force used by the metrology station, with the second chucking force being the same or substantially the same as the final first chucking force applied by the metrology station chucking mechanism, which may ensure that the substrate is in a substantially planar configuration atop the surface of the printing station. In particular, by using the same chucking force at the metrology station and the printing station may enable the actual measured die layout to be reproduced at the printing station, which may improve the precision of the printing process. In some embodiments, the method may optionally include measuring the topology of the substrate before and/or after applying the second chucking force in a manner similar to the process used at the metrology station (e.g., using one or more topology sensors). This may enable the printing station to verify that the substrate is in the substantially planar configuration when the printing process is commenced.

At operation 340, a printing pattern may be adjusted based on the mapping of the die pattern and/or the bevel topography. For example, a processor of the printing station may receive and analyze the mapping and calculate any deviations (e.g., shifts in lateral position and/or rotations and/or unexpected topography proximate the bevel) of any of the dies present on the substrate. Based on the deviations, the printing pattern may be adjusted to account for such deviations to ensure that connections between the die and any electrical connectors (such as copper pillars and/or other contacts) may be made when the printing is completed. For example, an arrangement of printable connectors may be altered such that the die connections and relevant electrical connectors are successfully made despite the deviations of one or more dies from the designed positions. Once the printing pattern has been adjusted to account for any deviations, the printing pattern may be printed on the exposed surface of the substrate at operation 345.

In some embodiments, after printing the printing pattern, the substrate may be transferred to a storage unit, such as storage unit 115. In some embodiments, the substrate may be transferred directly to the storage unit from the printing station, while in other embodiments, an intermediate transfer of the substrate to a buffer station may be conducted prior to transferring the substrate to the storage unit. For example, the printed substrate may be transferred to the buffer station, a new substrate may be loaded into the printing station, and the printed substrate may then be transferred to the storage unit while the other substrate is being printed. Such an arrangement may help increase throughput of the processing system.

In some embodiments, once printed, the substrate may undergo additional processing operations. As just one example, the substrate may have dies placed on an underside of the substrate as well. In such embodiments, the substrate may be flipped, and the measurement/printing process may be repeated for the unprinted side of the substrate.

Oftentimes, a number of substrates may be simultaneously measured and/or printed. For example, the processing system may include multiple substrate aligners, metrology stations, buffer stations, and/or printing stations, with each component of the processing system being able to accommodate one or more substrates at a time. This may enable numerous substrates to be prepared and printed simultaneously. Additionally, a number of substrates may be processed sequentially, with a number of substrates being prepared while other substrates are being printed. For example, while some substrates are being printed, a number of substrates may be aligned by the substrate aligner(s), measured at the metrology station, moved to a storage unit, and/or stored at the buffer station.

FIGS. 4A-4I show an exemplary sequence 400 for processing a number of substrates 480. Sequence 400 may involve any number of substrate processing systems, including substrate processing system 100 described herein. Sequence 400 may illustrate various operations of method 300 or other processing operations. While illustrated as being able to print and/or prepare four substrates simultaneously, it will be appreciated that any number of substrates may be processed at a given station simultaneously. At operation 405, a number of substrates 480a may be engaged from one or more storage units 115. The substrates 480a may each be transferred to one or more substrate aligners 120 at operation 410, where the substrates 480a will be aligned to a predetermined angular orientation. In some embodiments, the substrates may be aligned sequentially, while in other embodiments each substrate 480a may be aligned simultaneously. Upon being aligned, each of the substrates 480a may be transferred to a metrology station 125 at operation 415. There may be a singular metrology station 125 or there may be multiple metrology stations 125 that may each accommodate one or more substrates 480a. At the respective metrology station 125, each substrate 480a may be chucked and/or measured as described herein. Upon completion of metrology operations, at operation 420 each substrate 480a may be transferred to a printing station 135, which may adjust a printing pattern based on the measurements from the metrology station 125 and/or print various features (such as connections between the dies and corresponding connectors, such as copper pillars) onto the substrate 480a as described elsewhere herein.

While substrates 480a are being printed, a number of substrates 480b may be prepared for printing. For example, at operation 425, substrates 480b may be engaged from one or more storage units 115 and transferred to one or more substrate aligners 120. Upon being aligned, each of the substrates 480b may be transferred to a metrology station 125 at operation 430. Upon completion of metrology operations, each substrate 480b may be transferred to a buffer station 130 at operation 435. The substrates 480b may remain at the buffer station 130 while substrates 480a complete the printing operation. At operation 440, the substrates 480a may be transferred to open slots of the buffer station 130, and then substrates 480b may be transferred to the printing station 135. While substrates 480b are being printed, the substrates 480a may be transferred to storage units 115 at operation 445. It will be appreciated that the process flow described above may be continuous, with additional substrates 480 being introduced to the flow as one or more of the stations within the processing system become vacant, which may help further increase throughput of the processing system.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a region" includes a plurality of such regions, and reference to "the aperture" includes reference to one or more apertures and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of packaging a substrate, comprising:
    rotationally aligning a substrate to a predetermined angular position;
    transferring the substrate to a metrology station;
    measuring a topology of the substrate at the metrology station;
    applying a first chucking force to the substrate to flatten the substrate;
    generating a mapping of a die pattern on an exposed surface of the substrate;
    transferring the substrate to a printing station;
    applying a second chucking force to the substrate to flatten the substrate against a surface of the printing station;
    adjusting a printing pattern based on the mapping of the die pattern; and
    printing the printing pattern on the exposed surface of the substrate.

2. The method of packaging a substrate of claim 1, further comprising:
    varying a magnitude of the first chucking force across an area of the substrate based on the topology of the substrate.

3. The method of packaging a substrate of claim 1, wherein:
    the first chucking force is applied using one or both of a vacuum chuck and an electrostatic chuck.

4. The method of packaging a substrate of claim 1, further comprising:
    re-measuring the topology of the substrate after applying the first chucking force.

5. The method of packaging a substrate of claim 1, wherein:
    measuring a topology of the substrate comprises gathering data from one or both of a capacitive sensor and an optical sensor.

6. The method of packaging a substrate of claim 1, wherein:
    adjusting a printing pattern based on the mapping of the die pattern comprises adjusting at least a portion of the printing pattern based on one or both of a lateral position and rotational position of at least one die on the substrate.

7. The method of packaging a substrate of claim 1, wherein:
    the substrate comprises a first substrate; and
    the method comprises:
        while printing the printing pattern on the exposed surface of the first substrate:
            rotationally aligning a second substrate to the predetermined angular position;
            transferring the second substrate to the metrology station;
            measuring a second topology of the second substrate at the metrology station;
            applying a third chucking force to the second substrate to flatten the second substrate; and
            generating a second mapping of a die pattern on an exposed surface of the second substrate.

8. The method of packaging a substrate of claim 7, further comprising:
    transferring the second substrate to a buffer station.

9. The method of packaging a substrate of claim 8, further comprising:
    transferring the second substrate to the printing station;
    applying a fourth chucking force to the substrate to flatten the second substrate against the surface of the printing station;
    adjusting a second printing pattern of the second substrate based on the second mapping of the die pattern; and
    printing the second printing pattern on the exposed surface of the substrate.

10. A method of packaging a substrate, comprising:
    rotationally aligning a plurality of substrates to a predetermined angular position;
    measuring a topology of each substrate;
    applying a first chucking force to each substrate to flatten the respective substrate;
    generating a mapping of a die pattern for an exposed surface of substrate;
    transferring each substrate to a printing station;
    applying a second chucking force to each substrate to flatten the respective substrate against a surface of the printing station;
    adjusting a respective printing pattern for each substrate based on the mapping of the die pattern for each respective substrate; and
    printing the respective printing pattern on the exposed surface of each respective substrate.

11. The method of packaging a substrate of claim 10, further comprising:
    determining a magnitude of the first chucking force at a number of locations across an area of each substrate needed to flatten the respective substrate; and varying the magnitude of the first chucking force across the area of the respective substrate based on the determination.

12. The method of packaging a substrate of claim 10, wherein:
rotationally aligning each substrate to the predetermined angular position comprises:
identifying an alignment mark on the respective substrate; and
rotating the respective substrate to align the alignment mark to the predetermined angular position.

13. The method of packaging a substrate of claim 10, further comprising:
flipping each substrate to expose an unprinted surface of the respective substrate;
rotationally aligning each substrate to the predetermined angular position;
measuring the topology of each substrate;
applying a third chucking force to each substrate to flatten each respective substrate;
generating a mapping of an additional die pattern on the unprinted surface of each substrate;
transferring each substrate to the printing station;
applying a fourth chucking force to each substrate to flatten the respective substrate against the surface of the printing station;
adjusting an additional printing pattern based on the mapping of the additional die pattern; and
printing the additional printing pattern on the unprinted surface of each substrate.

14. The method of packaging a substrate of claim 10, wherein:
the first chucking force is different for at least one of the plurality of substrates.

15. The method of packaging a substrate of claim 10, wherein:
the first chucking force of a respective substrate and the second chucking force of the respective subtrate are equal.

16. The method of packaging a substrate of claim 10, further comprising:
transferring at least some of the plurality of substrates to a buffer station, wherein each of the at least some of the plurality of substrates is transferred to the printing station from the buffer station.

17. The method of packaging a substrate of claim 10, further comprising:
measuring a bevel angle on an edge of packaging for each substrate.

18. The method of packaging a substrate of claim 10, wherein:
adjusting the printing pattern based on the mapping of the die pattern comprises calculating one or more differences between the printing pattern and the mapping of the die pattern and adjusting a position of at least a portion of the printing pattern based on the one or more differences.

* * * * *